United States Patent [19]
Ikeda et al.

[11] Patent Number: 5,987,531
[45] Date of Patent: Nov. 16, 1999

[54] CONTROL BOARD SYSTEM INCLUDING A REMOVABLE TERMINAL STAND WHICH CAN EASILY CONFORM TO DIFFERENT SPECIFICATIONS AND POWER SOURCES

[75] Inventors: Katsushi Ikeda; Yoichi Goto; Taro Ando; Shigemi Kuriyama, all of Tokyo, Japan

[73] Assignee: Mitsubishi Denki Kabushiki Kaisha, Tokyo, Japan

[21] Appl. No.: 08/931,950

[22] Filed: Sep. 17, 1997

[30] Foreign Application Priority Data

Mar. 11, 1997 [JP] Japan ..................................... 9-056163

[51] Int. Cl.⁶ ............................. G06F 13/10; G06F 13/14
[52] U.S. Cl. .................................. 710/8; 710/11; 710/14; 710/103; 709/300; 395/500.48; 395/527
[58] Field of Search ..................................... 395/500, 821, 395/680, 882, 500.48, 527; 439/61; 710/1, 103, 8, 11, 14; 709/300

[56] References Cited

U.S. PATENT DOCUMENTS

| | | | |
|---|---|---|---|
| 4,790,762 | 12/1988 | Harms et al. | 439/59 |
| 5,233,501 | 8/1993 | Allen et al. | 361/733 |
| 5,547,386 | 8/1996 | Fredberg | 439/61 |
| 5,732,269 | 3/1998 | Compton et al. | 395/680 |

*Primary Examiner*—Thomas C. Lee
*Assistant Examiner*—Rehana Perveen
*Attorney, Agent, or Firm*—Sughrue, Mion, Zinn, Macpeak & Seas, PLLC

[57] ABSTRACT

A control board includes a plate 7 for the control board including a first printed board for mounting a control section 56 and a first connecter 9; and a removable terminal stand plate 1 including a second printed board for mounting a terminal stand 3, input circuit section 4 and output circuit section 5, and a second connector. The first and second connectors are connected to each other.

4 Claims, 10 Drawing Sheets

CONTROL BOARD SYSTEM INCLUDING A REMOVABLE TERMINAL STAND WHICH CAN EASILY CONFORM TO DIFFERENT SPECIFICATIONS AND POWER SOURCES

BACKGROUND OF THE INVENTION

1. Field of the Invention

The present invention relates to a control board for a controller.

2. Description of the Related Art

Figure 8:
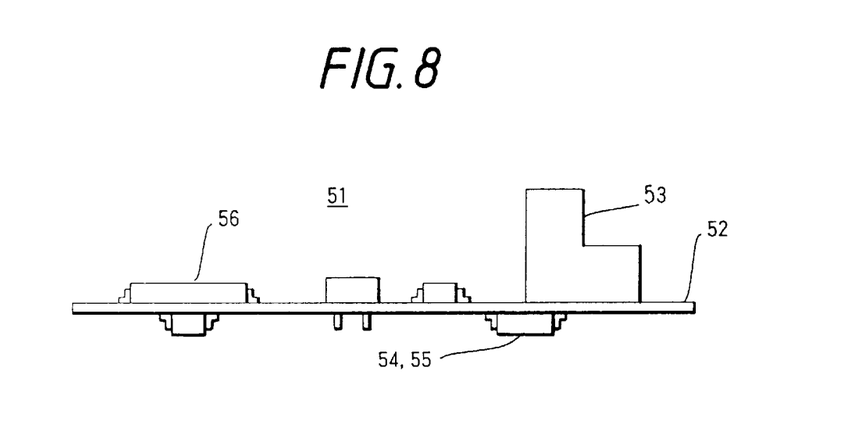
FIG. 8 is a view showing a conventional control board for a controller.

FIG. 8 is a view showing a conventional control board for a controller.

In FIG. 8, reference numeral 51 denotes a control board; 52 a printed board; 53 a terminal stand for connecting an external signal; 54 an input circuit section; 55 an output circuit section; and 56 a control section. The conventional control board 51 integrates the terminal stand 53, input circuit section 54, output circuit section 55 and control section 56 on the printed board 52.

The input circuit section 54 converts an external signal into a control signal processable by the control section 56 through an isolation means (not shown). The output circuit section 55 converts the control signal outputted from the control section 56 into the external signal through the isolation means (not shown).

Figure 9A:
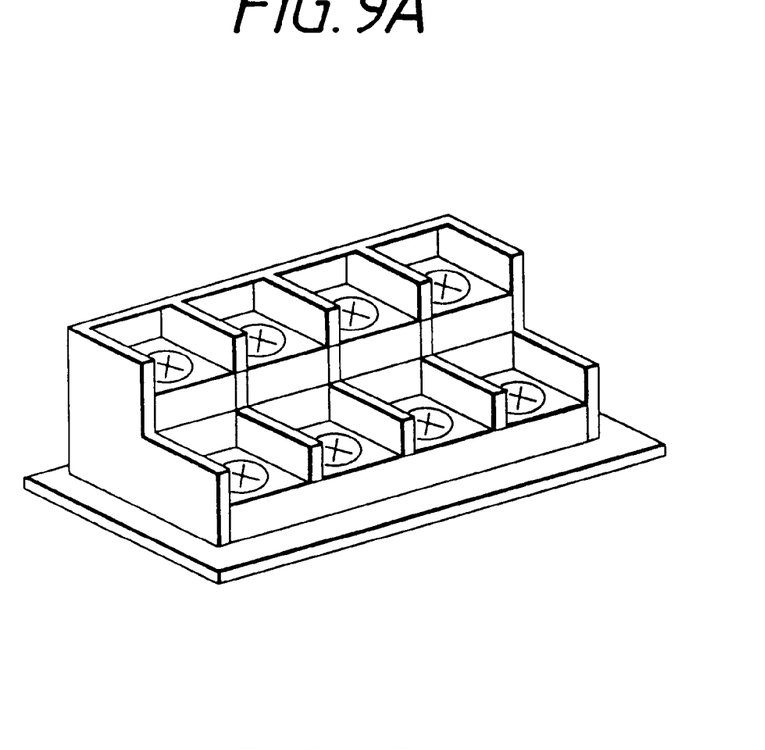
FIGS. 9A and 9B are views showing a terminal stand mounted on the control board for a controller.
Figure 9B:
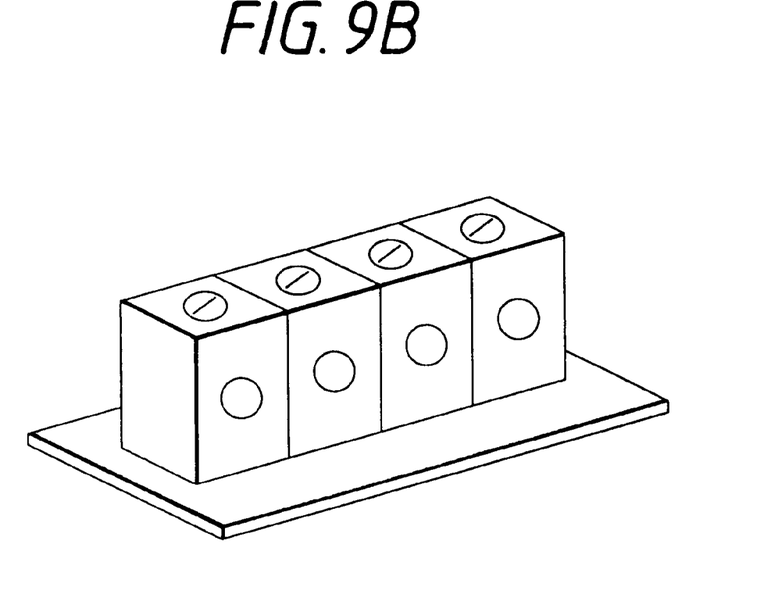

FIGS. 9A and 9B are views showing the terminal stand mounted on the conventional control board for a controller. FIG. 9A shows a terminal stand for a screw terminal which has been used generally in Japan, and FIG. 9B shows a terminal stand for a dipping terminal which has been generally used in Europe.

The input/output section such as the input circuit 54 and output circuit section 55 has also two kinds of input/output specifications including a sink specification and a source specification.

Figure 10:
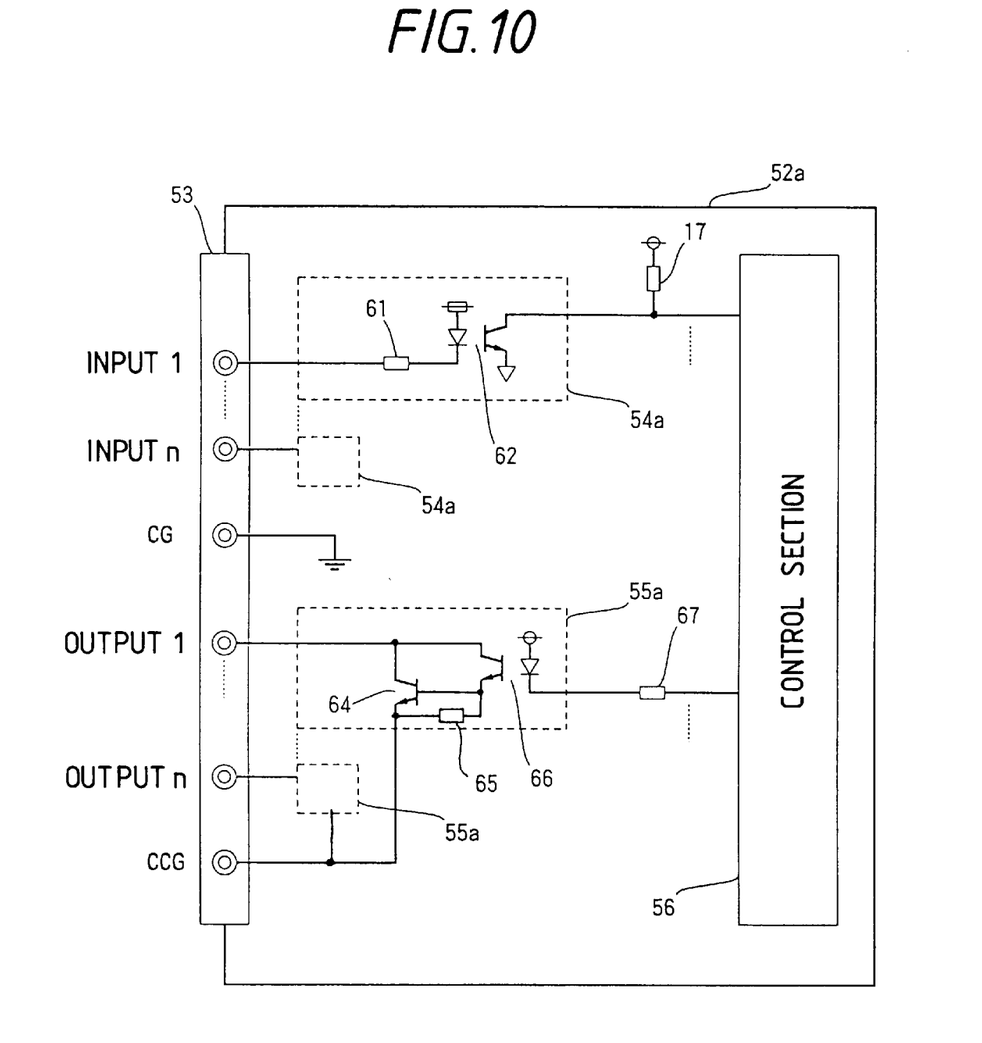
FIG. 10 is a view showing a conventional input/output circuit in a sink specification.
Figure 11:
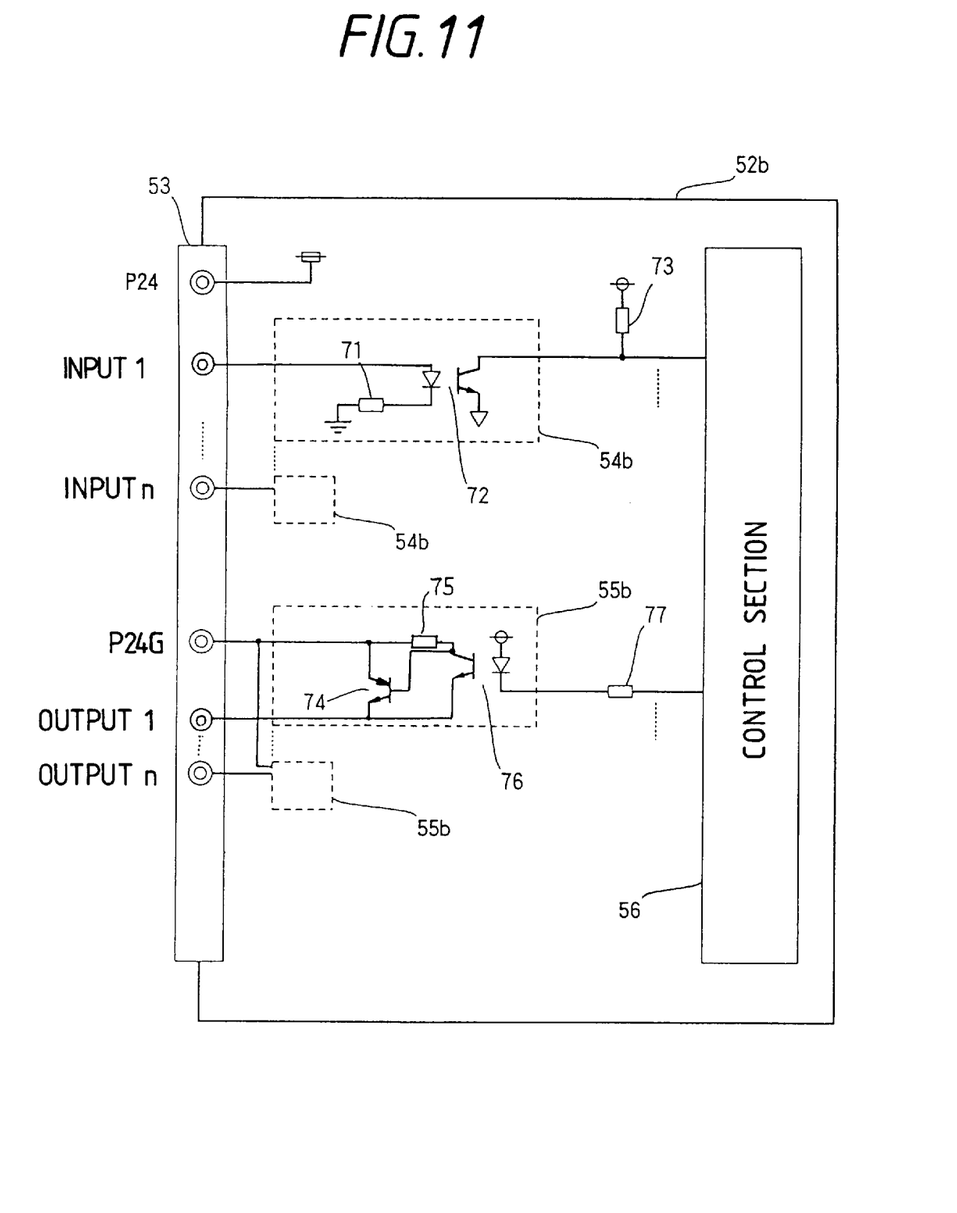
FIG. 11 is a view showing a conventional input/output circuit in a source specification.

FIG. 10 shows a conventional input/output circuit section in a sink specification. FIG. 11 shows a conventional input/output circuit section in a source specification.

In FIG. 10, inputs Nos. 1 to n denote input terminals for external signals; CG a common terminal for an external signal; outputs No. 1 to n output terminals for external signals; CCG an external output common terminal; 52a a printed board; 53 a terminal stand; 54a an input circuit section in a sink specification; 55a an output circuit section in the sink specification; 61 a resistor; 62 a photo-coupler; 17 a resister; 64 an npn transistor; 65 a resistor; 66 a photo-coupler; and 67 a resistor.

The inputs Nos. 1 to n and the outputs Nos. 1 to n have the same function, respectively. Their functions will be explained representatively for the input No. n and output No. n.

The input No. n is connected to the resistor 61 whose one terminal is connected to the cathode of an input LED of the photocoupler 62. When an input signal is supplied (the input No. n and CG are short-circuited) between the input No. n and CG, a current starts to flow from the input No. n to turn on the photocoupler 62.

The output No. n is connected to the collector of the npn transistor 64 and the output collector of the photocoupler 66. The external output common terminal CCG is connected to the emitter of the npn transistor 64 and the resistor 65. The emitter of the photocoupler 66 is connected to the one terminal of the resistor 65 and the base of the npn transistor 64.

In FIG. 11, reference symbol P24 denotes a 24 V terminal of an external signal; input No. 1 to n input terminals for external signals; P24G an external output 24 V terminal; outputs Nos. 1 to n output terminals for external signals; 52b a printed board; 53 a terminal stand; 54b an input circuit section in a source specification; 55b an output circuit section in a source spefication; 71 a resistor; 72 a photocoupler; 73 a resistor; 74 a pnp transistor; 75 a resistor; 76 a photocoupler; and 77 a resistor.

The inputs Nos. 1 to n and the outputs Nos. 1 to n have the same function, respectively. Their functions will be explained representatively for the input No. n and output No. n.

The input No. n is connected to the anode of an input LED of the photocoupler 72. The cathode of the input LED is connected to the resistor 71. The one terminal of the resistor 71 is connected to the 24 V common terminal. When the external signal is supplied between the input No. n and P24 (the input No. n and P24 are short-circuited), a current flows into the input No. n to turn on the photocoupler 72 so that the external signal is transferred.

The output No. n is connected to the collector of the npn transistor 74 and the output emitter of the photocoupler 76. The external output 24 V terminal P24G is connected to the emitter of the pnp transistor 74 and the resistor 75. The one terminal of the resistor 75 is connected to the output collector of the photocoupler 76 and the base of the pnp transistor 74.

Although the terminals used generally in each country are different (screw terminal in Japan and dipping terminal in Europe), the terminal control board integrates the terminal stand with the input circuit section, output circuit section and control section on the printed board so that a user cannot choose the terminal stand independently from the other parts of the board. For this reason, where the control appliance made in Japan is to be used in Europe, because the terminal stand is dedicated to the screw terminal, the crimping contact is not used and a less familiar contact must be prepared and wired.

Where a manufacturer assembles the control board, even with advancement of plane-mounting of components on the control board, because the terminal stand and the relay are DIP components, plane-mounted components are attached by an automatic insertion machine and thereafter the terminal stand and relay must be attached manually, thus increasing the number of steps.

While the control section is common, the input/output specification includes two kinds of specifications of sink specification and source specification. Therefore, the control boards dedicated to the sink specification and source specification, respectively must be prepared.

Further, the standard combination of the terminal stand and input/output specification in each country is the combination of screw terminal and sink specification in Japan and that of dipping terminal and source specification in Europe. For this reason, plural kinds of control boards with different combinations (e.g. combination of screw terminal and sink specification and that of dipping terminal and source terminal) must be prepared.

Where the initial value of the program in the control section must be set in accordance with the circumstances of power source in each country, plural kinds of control boards corresponding to the circumstances of power source (e.g. control boards with the initial values stored for domestic use and Europe use, respectively) must be prepared.

SUMMARY OF THE INVENTION

The present invention has been accomplished to solve the problem as described above.

A first object of the present invention is to provide a control board which can easily conform to different specifications of the terminal stand such as the screw terminal and dipping terminal and has good workability.

A second object of the present invention is to provide a control board which can easily conform to different input/output specifications such as sink specification and source specification.

A third object of the present invention is to provide a control board which can easily conform to different combinations of specification of terminal stand and input/output.

A fourth object of the present invention is to provide a control board which can easily conform to the circumstances of power source in each country.

To achieve the above objects, the control board according to the present invention comprises a plate for the control board including a control section, a first printed board for mounting the control section, and a first connecter; and a removable terminal stand plate including a removable terminal stand, an input circuit section, output circuit section, a second printed board for mounting said terminal stand, an input circuit section and output circuit section, and a second connector, said first and second connectors being connected to each other.

Said terminal stand includes an input terminal for an external signal, a terminal for power/common thereof, an external output terminal, and a terminal for power/common therefor; said input circuit section and said output circuit section include a wiring circuit which can select the mounting of components in accordance with the input/output specification of the sink specification and the source specification so that the presence or absence of mounting of the components on the wiring circuit is selected to accord with the sink specification or source specification.

A control board according to the invention, characterized in that said second printed board for the said removable terminal stand plate is made connectable to a discriminating resistor for discriminating at least one of the terminal specification and input/output specification, and said control section is adapted to decide the connecting status of the discriminating resistor to discriminate the terminal specification and the input/output specification.

Further, said control section is adapted to decide the connecting status of the discriminating resistor to change the initial value of the data of the program.

The above and other objects and features of the present invention will be more apparent from the following description taken in conjunction with the accompanying drawings.

DETAILED DESCRIPTION OF THE PREFERRED EMBODIMENTS

Now, a description will be given in more detail of preferred embodiments of the invention with reference to the accompanying drawings.

Embodiment 1

Figure 1:
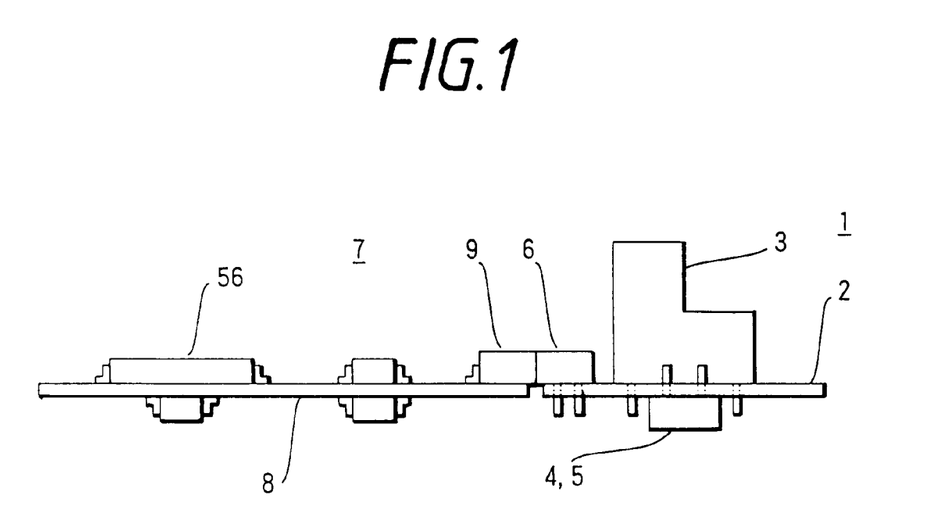
FIG. 1 is a view showing a control board using a removable terminal stand plate according to one embodiment of the present invention.

FIG. 1 is a view showing a control board equipped with a removable terminal stand plate according to one embodiment of the present invention.

In FIG. 1, reference numeral 1 denotes a removable terminal stand plate; 2 a printed board for the removable terminal stand; 3 a terminal stand; 4 an input circuit section; 5 an output circuit section; and 6 a connector. The removable terminal stand plate 1 mounts the terminal stand 3, input circuit section 4, output circuit 5 and connector 6 on the printed board 2 for the removable terminal stand plate 1.

The input circuit section 4 converts an external signal into a control signal processable by the control section 56 through an isolation means (not shown). The output circuit section 5 converts the control signal outputted from the control section 56 into the external signal through the isolation means (not shown).

Reference numeral 7 denotes a plate for the control board (control plate); 8 a printed board for mounting the control section; and 9 a connector.

The control board is constituted by connecting the control plate 7 and the removable terminal stand plate though the connectors 9 and 6.

On the printed board 2 for the removable terminal stand plate 1, the terminal stand 3, input circuit section 4, output circuit section 5 and connector 6 are mounted. All the DIP components mounted on the conventional control board are shifted onto the removable terminal stand plate 1. Thus, all the components on the control plate 7 are plane-mounted so that the control plate 7 can be mounted by an automatic insertion machine, thus improving workability.

As described above, with one kind of control plate, by changing the removable stand plate into the removable terminal stand plate equipped with a screw terminal or dipping terminal, a user can select the kind of the terminal stand (screw terminal or dipping terminal) in accordance with his comfort.

The above object can also be attained by shifting the input circuit section 4 and output circuit 5 on the removable terminal stand plate onto the control plate 7.

Figure 2:
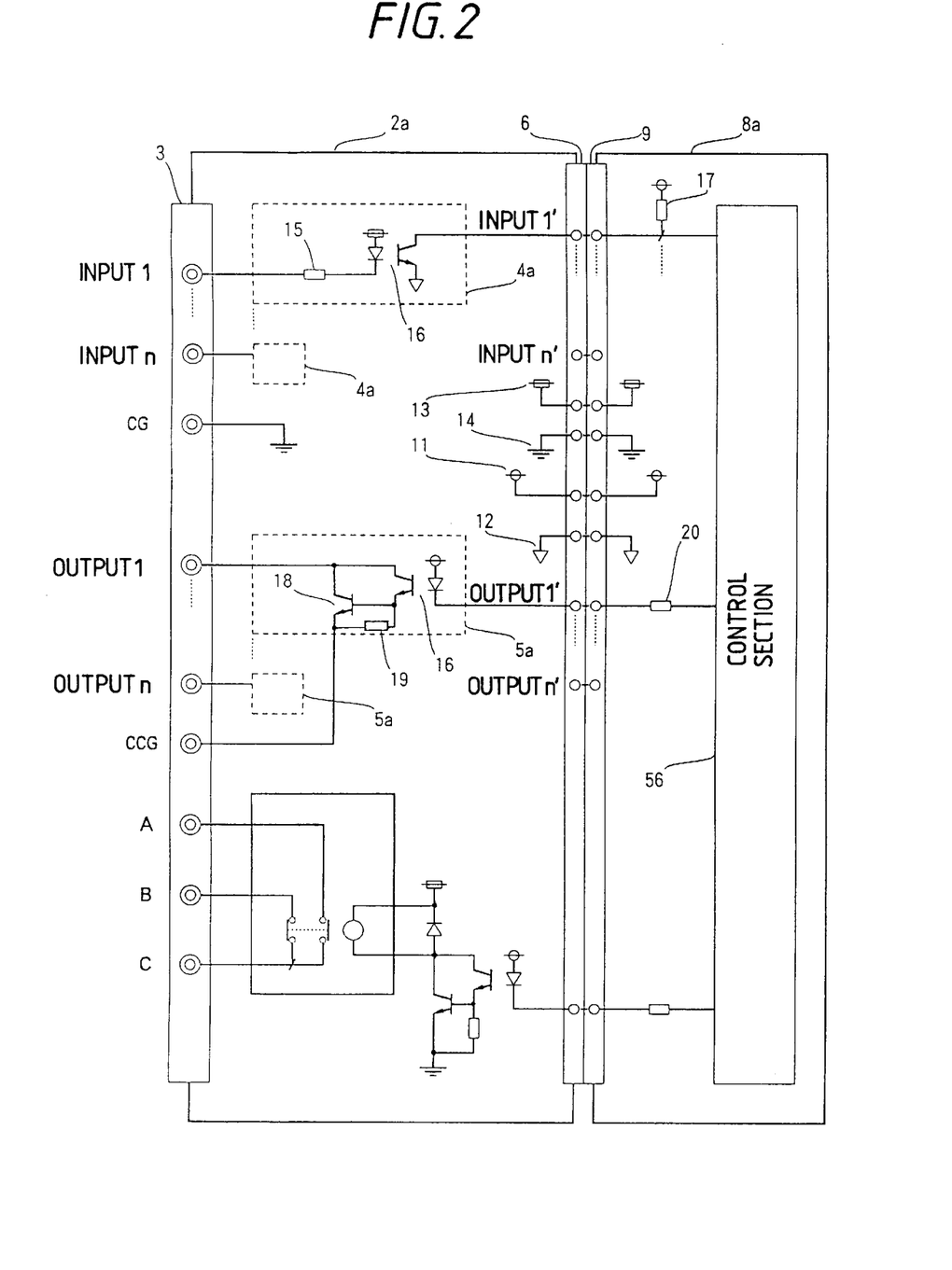
FIG. 2 is a view showing a control board using a removable terminal stand equipped with an input/output circuit in a sink specification according to an embodiment of the present invention.

FIG. 2 is a view showing a control plate equipped with a removable terminal stand board equipped with the input/output circuit section in a sink specification according to the one embodiment of the present invention.

In FIG. 2, reference numerals 1, 3, 6, 7, 9, 56, which refer to like parts in FIG. 1, are not explained here. In FIG. 2, 2*a* denotes a plate for the removable terminal stand; 4*a* an input circuit section in a sink specification; 5*a* an output circuit section in a sink specification; 8*a* a plate for the control board; 11 5 V; 12 a common for 5 V 11; 13 24 V; 13 a common for 24 V 13; 15 a resistor; 16 a photocoupler; 17 a resister; 18 an npn transistor; 19 a resistor; 20 a resistor.

It should be noted that 5 V 11, common 12 for 5 V 11, 24 V 13 and common 14 for 24 V 13 are supplied from the plate 8*a* for the control board through the connectors 6 and 9.

Inputs Nos. 1 to n denote input terminals for external signals; CG a common terminal for the external signal; output Nos. 1 to n external output terminals; and CCG an external output common terminal. These terminals are mounted on the terminal stand 3.

The inputs Nos. 1 to n and the outputs Nos. 1 to n have the same function, respectively. Their functions will be explained representatively for the input No. n and output No. n.

The input No. n is connected to the resistor 15 whose one terminal is connected to the cathode of an input LED of the photocoupler 16. The anode of the input LED is connected to 24 V 13. The output emitter of the photocoupler 16 is connected to the common for 5 V 11. Its collector is connected to input n' provided on in the connector 6. The common terminal CG for the external signal is connected to 24 V common 14. The input n' is connected to the resistor 17 and control section 56 on the plate 8*a* through the connectors 6 and 9. The one terminal of the resistor 17 is connected to 5 V 11. When the external signal is supplied between the input No. n and CG (the input No. n and CG are short-circuited), a current starts to flow from the input No. n to turn on the photocoupler 16 so that the external signal is transferred to the control section 56.

The output No. n is connected to the output collector of the npn transistor 18 and the output collector of the photocoupler 16. CCG is connected to the emitter of the transistor 18 and the resistor 19. The base of the transistor 18 is connected to the output emitter of the photocoupler 16 and the one terminal of the resistor 19. The anode of the input LED of the photocoupler 16 is connected to 5 V 13 while its cathode is connected to the output No. n' provided on the connector 6. The output No. n' is connected to the resistor 20 and the control section 56 on the plate 8*a* for the control board through the connector 9. When a signal 0 V is supplied to the output n' from the control section 56, the photocoupler 16 turns on and hence the transistor 18 turns on. The output n and CCG are short-circuited (the output produced).

Figure 3:
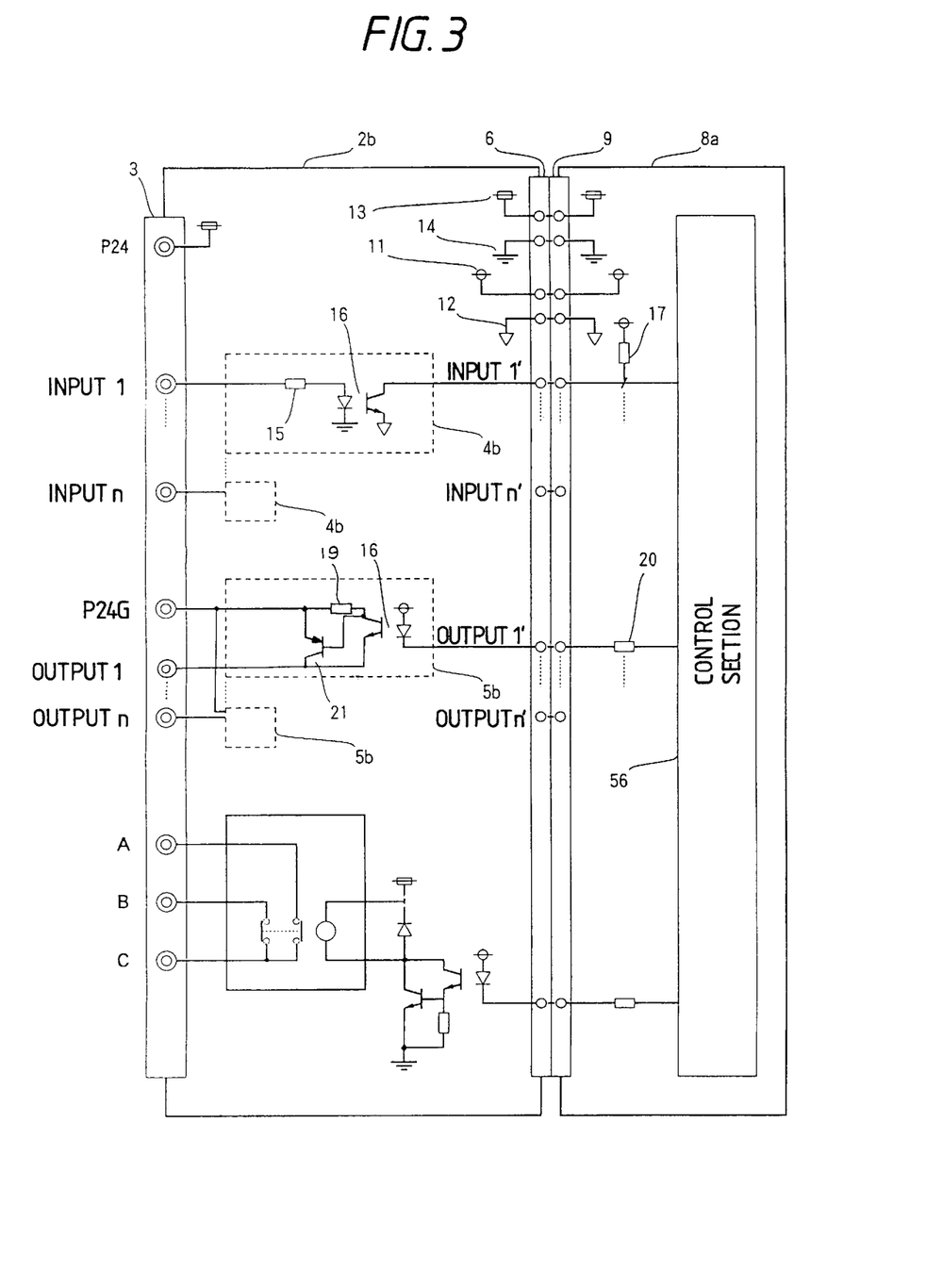
FIG. 3 is a view showing a control board using a removable terminal stand equipped with an input/output circuit in a source specification according to an embodiment of the present invention.

FIG. 3 is a view showing a control board using the removable terminal stand plate equipped with the input/output circuit section in a source specification according to one embodiment of the present invention.

In FIG. 3, reference numerals 1, 3, 6, 7, 9, 56, which refer to like parts in FIG. 1, are not explained here. In FIG. 3, 2*b* denotes a plate for the removable terminal stand; 4*b* an input circuit section in a source specification; 5*b* an output circuit section in a source specification; 8*a* a plate for the control board; 11 5 V; 12 a common for 5 V 11; 13 24 V; 13 a common for 24 V 13; 15 a resistor; 16 a photo-coupler; 17 a resister; 18 an npn transistor; 19 a resistor; 20 a resistor; and 21 a pnp transistor.

It should be noted that 5 V 11, common 12 for 5 V 11, 24 V 13 and common 14 for 24 V 13 are supplied from the plate 8*a* for the control board through teh connectors 6 and 9.

Inputs Nos. 1 to n denote input terminals for external signals; P24 a 24 V terminal for the external signal; the outputs Nos. 1 to n external output terminals; P24G an external output 24 V terminal; and CCG an external output common terminal. These terminals are mounted on the terminal stand 3.

The inputs Nos. 1 to n and the outputs Nos. 1 to n have the same function, respectively. Their functions will be explained representatively for the input No. n and output No. n.

The input No. n is connected to the resistor 15 whose one terminal is connected to the anode of an input LED of the photocoupler 16. The cathode of the input LED is connected to 24 V common 14. The output emitter of the photocoupler 16 is connected to 5 V common 12. Its collector is connected to input n' provided on in the connector 2. The 24 V terminal P24 for the external signal 24 is connected to 24 V 13. The input n' is connected to the resistor 17 and control section 56 on the plate 8*a* through the connectors 6 and 9. The one terminal of the resistor 17 is connected to 5 V 11. When the external signal is supplied between the input No. n and CG (the input No. n and CG are short-circuited), a current flows into the input No. n to turn on the photocoupler 16 so that the external signal is transferred to the input No. n.

The output No. n is connected to the collector of the npn transistor 21 and the output emitter of the photocoupler 16. The external output 24 V P24G is connected to the emitter of the transistor 21 and the resistor 19. The one terminal of the resistor 19 is connected to the output collector of the photocoupler 16 and the base of the transistor 21. The anode of the input LED of the photocoupler 16 is connected to 5 V 13 while its cathode is connected to the output No. n' provided on the connector 6. The output No. n' is connected to the resistor 20 and the control section 56 on the plate 8*a* for the control board through the connector 9. When a signal 0 V is supplied to the output n' from the control section 56, the photocoupler 16 turns on and hence the transistor 21 turns on. The output No. n and P24G are short-circuited (the output produced).

As described above, with one kind of control plate, by changing the removable stand plate into the removable terminal stand plate equipped with the input/output circuit section in a sink specification or source specification, a user can select the specification of input/output in accordance with his comfort.

Embodiment 2

Figure 4:
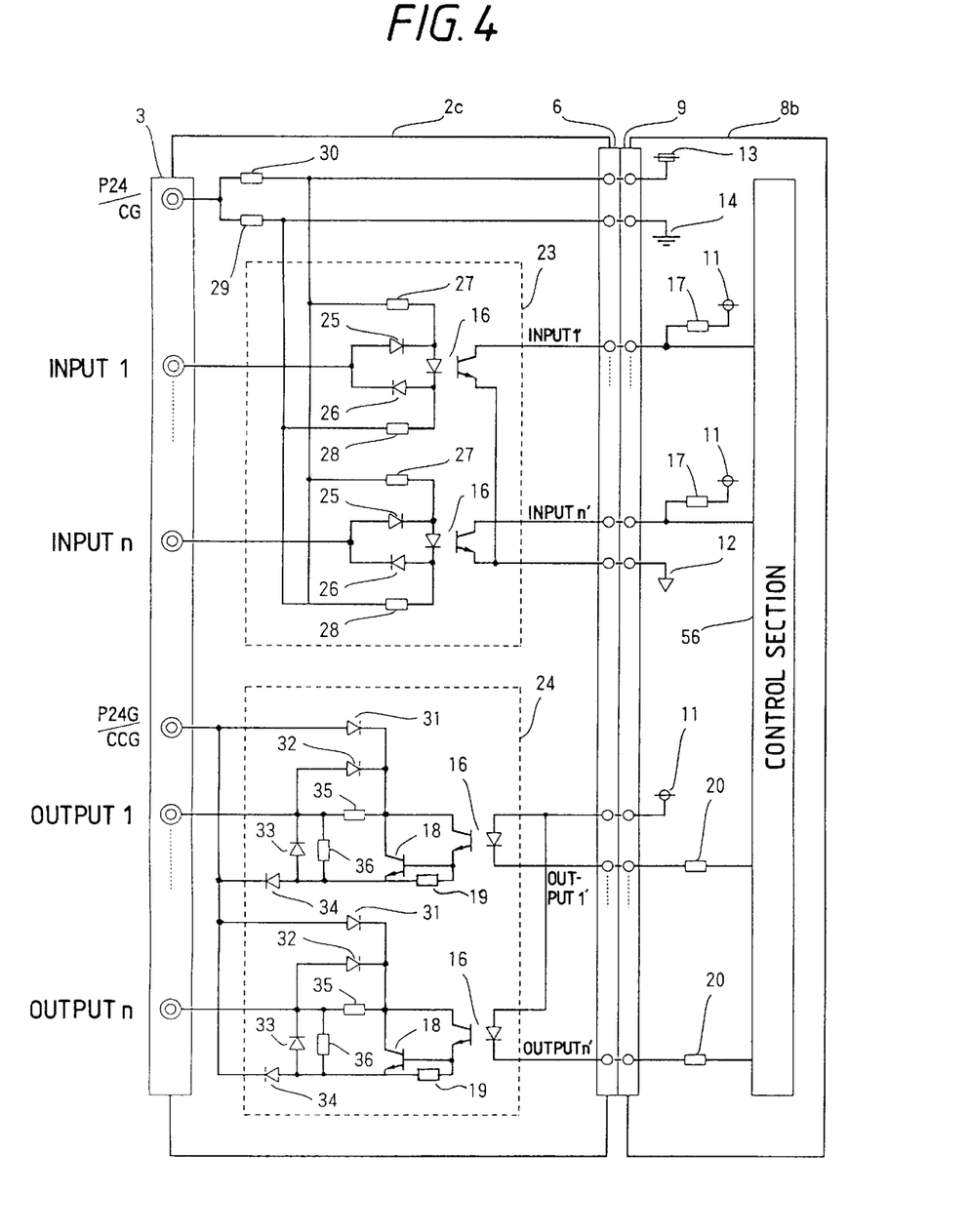
FIG. 4 is a view showing a control board using a removable terminal stand equipped with a sink/source exchanging input/output circuit according to an embodiment of the present invention.

FIG. 4 is a view showing the control board using the removable terminal stand plate equipped with a sink/source exchanging input/output circuit section according to one embodiment of the present invention.

In FIG. 4, reference numerals 3, 6, 7, 9, and 56, which refer to like parts in FIG. 1, are not explained here. In FIG. 4, 2*c* denotes a plate for the removable terminal stand; 8*b* a plate for the control board; 11 5 V; 12 a common for 5 V 11; 13 24 V; 14 a common for 24 V 13; 16 a photocoupler; 17 a resister; 18 an npn transistor; 19, 20 a resistor; 23 a input circuit section; 24 an output circuit section; 25, 26 a diode; 27, 28 a photocoupler resistor; 29, 30 a zero ohm resistor; 31, 32, 33, 34 a diode; and 35, 36 a zero ohm resistor. It should be noted that 5 V 11, common 12 for 5 V 11, 24 V 13 and common 14 for 24 V 13 are supplied from the plate 8*b* for the control board through the connectors 6 and 9.

Inputs Nos. 1 to n denote input terminals for external signals; P24/CG a terminal for power/common thereof; output Nos. 1 to n external output terminals; and P24G/CCG a terminal for power/common thereof. These terminals are mounted on the terminal stand 3.

The inputs Nos. 1 to n and the outputs Nos. 1 to n have the same function, respectively. Their functions will be explained representatively for the input No. n and output No. n.

In the input circuit section 23, the external input terminal input No. n is connected to the cathode of the diode 25 and the cathode of the diode 26. The cathode of the diode 25 is connected to the anode of the input LED of the photocoupler 16 and the photocoupler driving resistor 27. The one terminal of the driving resistor 27 is connected to 24 V 13, zero ohm resistor 30 and the driving resistor 27 of the other input circuit section. The one terminal of the zero ohm resistor 30 is connected to P24/CG terminal provided on the terminal stand 3. The anode of the diode 26 is connected to the cathode of the input LED of the photocoupler 16 and the photocoupler driving resistor 28. The one terminal of the driving resistor 28 is connected to 24 V common 14, zero ohm resistor 29 and the driving resistor 28 of the other input circuit section. The one terminal of the zero ohm resistor 29 is connected to P24/CG terminal. The output collector of the photocoupler 16 is connected to the input No. n' provided on the connector 6. Its emitter is connected to the emitter of the photocoupler 16 of the other input circuit portion and to 5 V common 12. Its input terminal n' is connected to the load resistor 17 and control section 6 on the plate for the control board through the connectors 6 and 9.

In the output circuit section 24, the external output terminal output No. n is connected to the anode of the diode 32, cathode of the diode 33 and zero ohm resistors 35, 36. The one terminal of the zero ohm resistor 35 is connected to the cathode of the diode 32, cathode of the diode 31, collector of the npn transistor and output collector of the photocoupler 16. The terminal of the zero ohm resistor 36 is connected to the anode of the diode 33, anode of the diode 34, emitter of the npn transistor and resistor 19. P24G/CCG is connected to the anode of each diode 31 and cathode of each diode 34 in the entire output circuit section. The base of the transistor 18 is connected to the one terminal of the resistor 19 and the output emitter of the photocoupler 16. The anode of the input LED of the photocoupler 16 is connected to 5 V 11 and the cathode is connected to output No. n' provided on the connector 6. The output No. n' is connected to the driving resistor 20 on the plate for the control board through the connectors 6 and 9, and the one terminal of the resistor 20 is connected to the control section 56.

Figure 5:
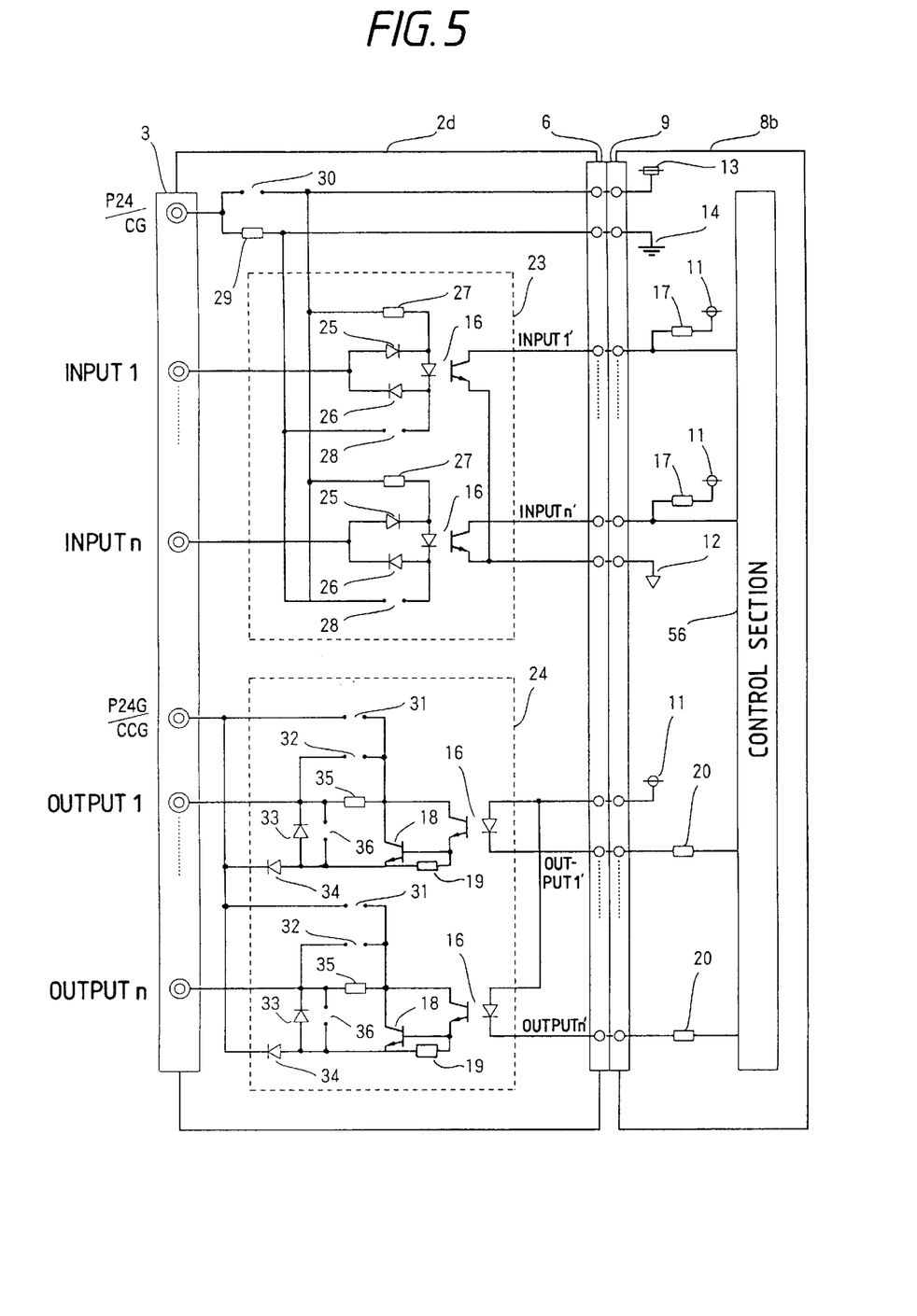
FIG. 5 is a view showing a removable terminal stand plate incorporating an input/output circuit section in a sink specification according to an embodiment of the present invention.

FIG. 5 is a view showing the control board using the plate for the removable terminal stand incorporating the input/output in a sink specification according to one embodiment of the present invention.

In FIG. 5, reference numerals 3, 6–9, 11–14, 16–20, 23–27, 29, 33–35, and 56, which refer to like parts in FIG. 4, are not explained here.

The inputs Nos. 1 to n and the outputs Nos. 1 to n have the same function, respectively. Their functions will be explained representatively for the input No. n and output No. n.

In the input circuit section 23, when an external signal is supplied between the input No. n to CG (short-circuiting is made between the input No. n and P24/CG), a current flows out form the input No. n through the photocoupler driving resistor 27, input LED of the photocoupler 16 and diode 26 from 24 V 13. Then, the photocoupler 16 turns on so that the signal is transferred to the input No. n'. The operation of the output circuit section 24 means that the circuit equivalent to the input circuit section 4a in FIG. 2 is connected. For this reason, the input No. n terminal is connected to the output No. n of the output circuit section 24, and the CG terminal of the input circuit section 4a is connected to P24G/CCG terminal of the output circuit section 24. As a result that the signal is outputted from the control section 56, when the transistor 18 turns on, a current flows in from the output No. n terminal. The current flows out from the P24G/CCG terminal through the zero ohm resistor 35, npn transistor 18 and diode 34.

Figure 6:
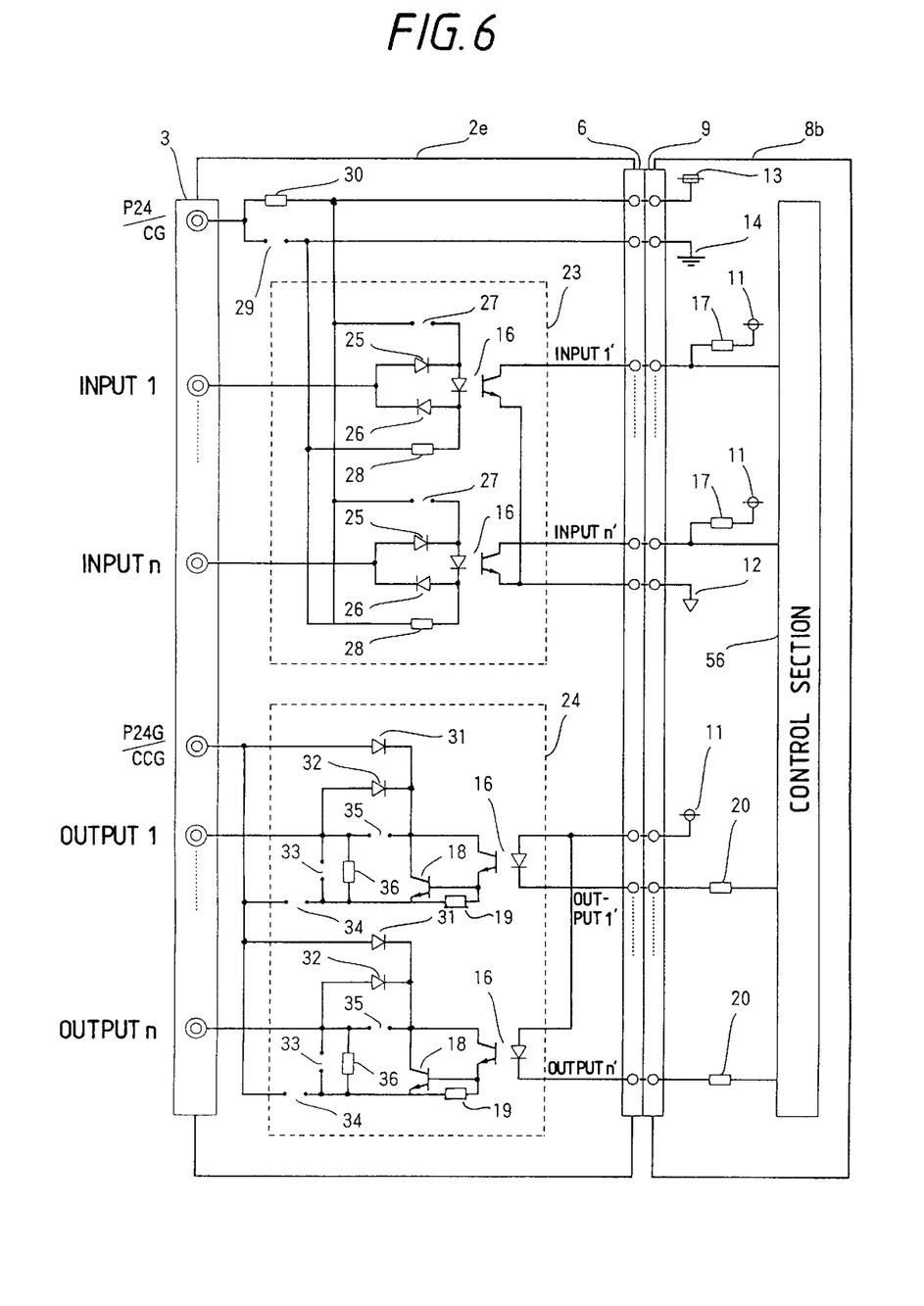
FIG. 6 is a view showing a removable terminal stand plate incorporating an input/output circuit section in a source specification according to an embodiment of the present invention.

FIG. 6 is a view showing the control board using a removable terminal stand plate incorporating the input/output circuit section in a source specification according to one embodiment of the present invention.

In FIG. 6, 3, 6–9, 11–14, 16–20, 23–26, 28, 30–32, 36 and 56, which refer to like parts in FIG. 4, will not be here. Reference numeral 2e denotes the removable terminal stand plate.

FIG. 6 shows the removable terminal stand plate with the components in the source specification. It is equivalent to that with the input circuit section in FIG. 4 from which the photocoupler driving resistor 27, zero ohm resistors 29, 35 and diodes 33, 34 are removed.

The inputs Nos. 1 to n and the outputs Nos. 1 to n have the same function, respectively. Their functions will be explained representatively for the input No. n and output No. n.

In the input circuit section 23, when an external signal is supplied between the input No. n to CG (short-circuiting is made between the input No. n and P24/CG), a current flowed out from the input No. n flows in the input No. n terminal and further flows through the diode 25, input LED of the photocoupler 16 and photocoupler driving resistor 28. Then, the photocoupler 16 turns on so that the signal is transferred to the input No. n'. The operation of the output circuit section 24 means that the circuit equivalent to the input circuit section 4a in FIG. 3 is connected. For this reason, the input No. n terminal of the input circuit section 4b is connected to the output No. n of the output circuit section 24, and the CG terminal of the input circuit section 4a is connected to P24G/CCG terminal of the output circuit section 24. As a result that the signal is output from the control section 56, when the transistor 18 turns on, a current flows in from the output No. n terminal. The current flows out from the output No. n through the diode 31, npn transistor 18 and zero ohm resistor 36.

As described above, with one kind of control plate, by changing the removable stand plate into the removable terminal stand plate equipped with the input/output circuit section in a sink specification or source specification, a manufacturer can prepare the terminal stand plate with the sink specification or source specification for the input/output section by a single plate.

In the configuration of FIG. 4, by changing the mounting state of the components such as a resistor and diode as shown in FIGS. 5 and 6 in the one kind of removable terminal stand, the input/output specification can exchanged between the sink specification and source specification.

Embodiment 3

Figure 7:
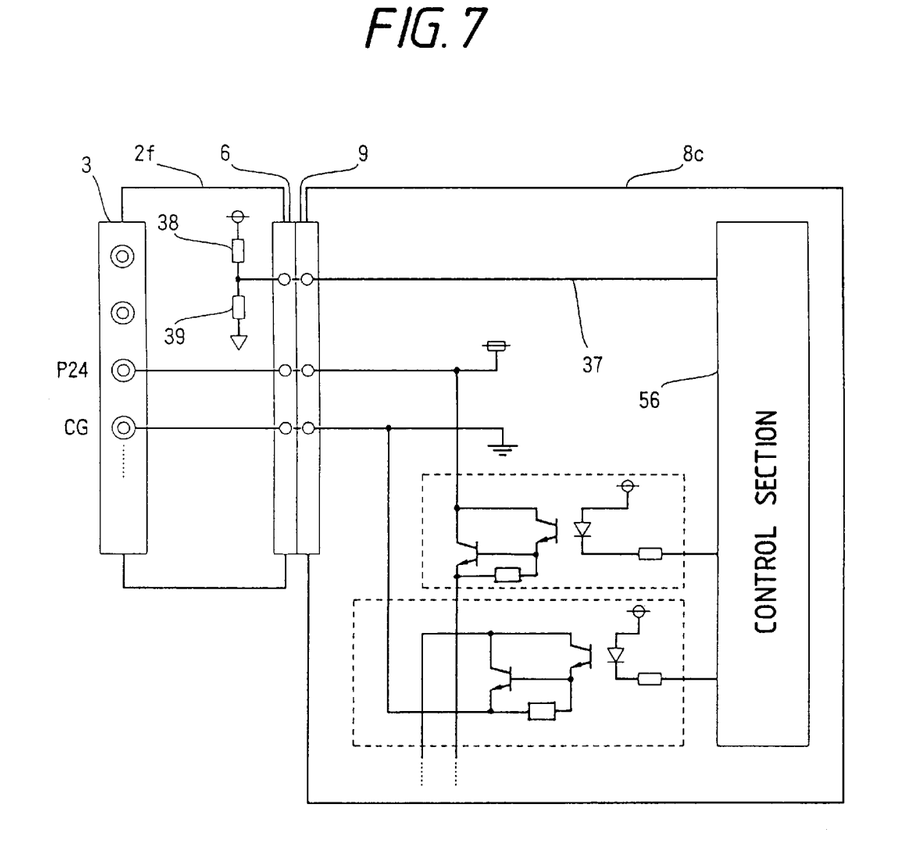
FIG. 7 is a view showing a control board using a removable terminal stand plate according to an embodiment.

FIG. 7 is a view showing the control board using a removable terminal stand plate according to one embodiment of the present invention.

In FIG. 7, reference numeral 2f denotes a removable terminal stand plate; 3 a terminal stand; 6 a connector; 8c a plate for the control board; 9 a connector; 37 a discriminating signal of the terminal stand plate, provided on the connector 6; 38, 39 a discriminating resistor for discriminating at least one of the terminal specification and input/output specification; 56a a control section for deciding the connection status of the discriminating resistors 38, 39 to discriminate the terminal specification or input/output specification.

The discriminating signal 37 is connected from the connector 9 to the control section 56a on the plate 8c for the control board, and connected from the connector 6 to the resistors 38, 39 on the removable terminal stand plate 2f. The one terminal of the resistor 38 is connected to 5 V 11 and the one terminal of the resistor 39 is connected to the 5 V common 12.

The control board according to this embodiment is structured so that the discriminating resistor for discriminating at least one of the terminal specification and the input/output specification can be connected to a printed board for the removable terminal stand plate and the control section decides the connecting status of the discriminating resistor to discriminate the terminal specification or input/output specification.

Where the terminal stand 3 of the removable terminal stand plate 2f is provided for the screw terminal or the input/output circuit is in a sink specification, the resistor 38 is mounted but the resistor 39 is not mounted. On the other hand, where the terminal stand 3 on the plate therefor is provided for the dipping terminal or the input/output circuit section is in a source specification, the resistor 39 is mounted but the resistor 38 is not mounted.

An explanation will be given of the operation. Where the discriminating signal 37 is 5 V, the control section 56 discriminates the screw terminal or sink specification. Where it is 0 V, the control section 56 discriminates the dipping terminal or source terminal.

Generally, in Japan, a screw terminal stand has been used and the specification of input/output is the sink specification. On the other hand, the terminal stand for a dipping terminal has been used in Europe and its specification of input/output is the source specification. Therefore, using the discriminating signal 37, the control board can decide whether the removable terminal stand plate is in the domestic specification or the Europe specification.

The initial value of the program in the control section 56a must be set in accordance with the circumstances of power source in each country. But where the removable terminal stand plate is exchanged, using the above discriminating signal, the control section 56a decides the kind of the removable terminal stand plate to select the initial value of the data of the program according to the circumstances of the power source. Thus, the initial value of the data of the program can be changed in accordance with the circumstances of power source in Japan and Europe so that one kind of control program has only to be used.

Since the present invention can be constructed as described above, the following effects can be obtained.

The control board according to the present invention comprises a plate for the control board including a control section, a first printed board for mounting the control section and a first connecter; and a removable terminal stand plate including a removable terminal stand, an input circuit section, output circuit section, a second printed board for mounting said terminal stand, input circuit section and output circuit section, and a second connector, and said first and second connectors are connected to each other. For this reason, the control board is compatible with different specifications of the terminal stand such as the screw terminal and dipping terminal.

Said terminal stand includes an input terminal for an external signal, a terminal for power/common thereof, an external output terminal, and a terminal for power/common therefor; said input circuit section and said output circuit section include a wiring circuit which can select the mounting of components in accordance with the input/output specification of the sink specification and the source specification so that the presence or absence of mounting of the components on the wiring circuit is selected to accord with the sink specification or source specification. For this reason, the control board according to the present invention is compatible with different input/output specifications such as the sink specification and source specification.

Said second printed board for the said removable terminal stand plate is made connectable to a discriminating resistor for discriminating at least one of the terminal specification and input/output specification, and said control section is adapted to decide the connecting status of the discriminating resistor to discriminate the terminal specification or the input/output specification. For this reason, the control board can deal with a combination of the specification of the terminal stand and the specification of input/output.

Said control section is adapted to decide the connecting status of the discriminating resistor to change the initial value of the data of the program. For this reason, the control board according to the present invention can easily conform to the circumstances of power source in each country of Japan and Europe.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A control board comprising:
   a plate for the control board including a control section, a first printed board for mounting the control section and a first connector; and
   a removable terminal stand plate including a removable terminal stand, and input circuit section, an output circuit section, a second printed board for mounting said terminal stand, input circuit section and output circuit section, and a second connector,
   wherein said first and second connectors being connected to each other and an external input signal input through the input circuit section, passes through the first and second connectors to the control section, and that an output signal is supplied from the control section through the first and second connectors and received at the output circuit section to output the output signal.

2. A control board comprising:
   a plate for the control board including a control section, a first printed board for mounting the control section and a first connector; and a removable terminal stand plate including a removable terminal stand, and input circuit section, an output circuit session, a second printed board for mounting said terminal stand, input circuit section and output circuit section, and a second connector, wherein said first and second connectors being connected to each other and characterized in that said terminal stand includes an input terminal for an external signal, a terminal for power/common thereof, an external output terminal, and a terminal for power/common therefor; said input cicuit section and said output circuit section include a wiring circuit which can select a mounting of components in accordance with an input/output specification of a sink specification and a source specification so that a presence or an absence of mounting of components on the wiring circuit is selected to accord with the sink specification or source specification.

3. A control board comprising:

a plate for the control board including a control section, a first printed board for mounting the control section and a first connector; and a removable terminal stand plate including a removable terminal stand, and input circuit section, an output circuit section, a second printed board for mounting said terminal stand, input circuit section and output circuit section, and a second connector, wherein said first and second connectors being connected to each other and characterized in that said second printed circuit board for the said removable terminal stand plate is made connectable to a discriminating resistor for discriminating at least one of a terminal specification and an input/output specification, and said control section is adapted to decide a connecting status of the discriminating resistor to discriminate the terminal specification or the input/output specification.

4. A control board according to claim 3, characterized in that said control section is adapted to decide the connecting status of the discriminating resistor to change initial values of data of a program.

\* \* \* \* \*